United States Patent
Ohashi et al.

(10) Patent No.: US 9,755,064 B2
(45) Date of Patent: Sep. 5, 2017

(54) SEMICONDUCTOR DEVICE AND METHOD FOR MANUFACTURING THE SAME

(71) Applicant: Kabushiki Kaisha Toshiba, Minato-ku (JP)

(72) Inventors: Teruyuki Ohashi, Kawasaki (JP); Yuichiro Mitani, Miura (JP); Tatsuo Shimizu, Shinagawa (JP); Ryosuke Iijima, Setagaya (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 15/048,112

(22) Filed: Feb. 19, 2016

(65) Prior Publication Data

US 2016/0247907 A1  Aug. 25, 2016

(30) Foreign Application Priority Data

Feb. 24, 2015  (JP) .................... 2015-033595

(51) Int. Cl.
| | |
|---|---|
| H01L 29/78 | (2006.01) |
| H01L 29/16 | (2006.01) |
| H01L 29/04 | (2006.01) |
| H01L 29/10 | (2006.01) |
| H01L 21/04 | (2006.01) |

(Continued)

(52) U.S. Cl.
CPC ........ H01L 29/7802 (2013.01); H01L 21/049 (2013.01); H01L 21/3003 (2013.01); H01L 29/045 (2013.01); H01L 29/1095 (2013.01); H01L 29/1608 (2013.01); H01L 29/66068 (2013.01)

(58) Field of Classification Search
CPC .............. H01L 29/7802; H01L 21/049; H01L 21/3003; H01L 29/045; H01L 29/1095; H01L 29/1608; H01L 29/66068
See application file for complete search history.

(56) References Cited

U.S. PATENT DOCUMENTS

2004/0110338 A1* 6/2004 King ................... H01L 27/11
438/238
2008/0203402 A1  8/2008 Endo et al.
(Continued)

FOREIGN PATENT DOCUMENTS

| JP | 2006-196713 | 7/2006 |
| JP | 2008-244455 | 10/2008 |
| JP | 2012-186490 | 9/2012 |

*Primary Examiner* — Fernando L Toledo
*Assistant Examiner* — Neil Prasad
(74) *Attorney, Agent, or Firm* — Oblon, McClelland, Maier & Neustadt, L.L.P.

(57) ABSTRACT

A semiconductor device of an embodiment includes a SiC layer having a surface, the surface inclined at an angle of 0° to 10° with respect to a {000-1} face or the surface having a normal line direction inclined at an angle of 80° to 90° with respect to a <000-1> direction, a gate electrode, a gate insulating layer provided between the surface and the gate electrode, and a region provided between the surface and the gate insulating layer, a maximum concentration of deuterium (D) in the region being $1 \times 10^{20}$ $cm^{-3}$ or more and a maximum concentration of hydrogen (H) in the region being $1 \times 10^{19}$ $cm^{-3}$ or less.

18 Claims, 13 Drawing Sheets

(51) Int. Cl.
*H01L 29/66* (2006.01)
*H01L 21/30* (2006.01)

(56) References Cited

U.S. PATENT DOCUMENTS

| | | | |
|---|---|---|---|
| 2008/0203441 A1* | 8/2008 | Endo | H01L 21/049 257/255 |
| 2011/0057202 A1* | 3/2011 | Kono | H01L 29/0619 257/77 |
| 2013/0153889 A1* | 6/2013 | Yamazaki | H01L 21/02565 257/43 |

* cited by examiner

SEMICONDUCTOR DEVICE AND METHOD FOR MANUFACTURING THE SAME

CROSS-REFERENCE TO RELATED APPLICATION

This application is based upon and claims the benefit of priority from Japanese Patent Application No. 2015-033595, filed on Feb. 24, 2015, the entire contents of which are incorporated herein by reference.

FIELD

Embodiments described herein relate generally to a semiconductor device and a method for manufacturing the same.

BACKGROUND

Silicon carbide (SiC) is expected to be a material for a next-generation semiconductor device. SiC has excellent physical properties, such as a triple the band gap, about ten times the breakdown field strength, and about triple the thermal conductivity of silicon (Si). By utilizing the characteristics, a semiconductor device that is low loss and capable of operating at high temperature can be implemented.

However, when a metal insulator semiconductor (MIS) structure is formed using SiC, the amount of interface state existing between a semiconductor and an insulating film is larger than Si. Consequently, charge mobility is reduced, and which causes a problem that on-resistance of a metal insulator semiconductor field effect transistor (MISFET) or an insulated gate bipolar transistor (IGBT) becomes high.

DETAILED DESCRIPTION

A semiconductor device of an embodiment includes a SiC layer having a surface, the surface inclined at an angle of 0° to 10° with respect to a {000-1} face or the surface having a normal line direction inclined at an angle of 80° to 90° with respect to a <000-1> direction, a gate electrode, a gate insulating layer provided between the surface and the gate electrode, and a region provided between the surface and the gate insulating layer, a maximum concentration of deuterium (D) in the region being $1 \times 10^{20}$ cm$^{-3}$ or more and a maximum concentration of hydrogen (H) in the region being $1 \times 10^{19}$ cm$^{-3}$ or less.

Hereinafter, embodiments of the present disclosure will be described with reference to the drawings. Note that, in the following description, the same reference signs are assigned to the same members and the like, and the description of the member that has been described will be appropriately omitted.

Furthermore, in the following description, n', n, and n$^-$, or p$^+$, p, and p$^-$ represent relative levels of impurity concentration in each conductive type. That is, n$^+$ has a relatively higher n-type impurity concentration than n, and n$^-$ has a relatively lower n-type impurity concentration than n. Furthermore, p$^+$ has a relatively higher p-type impurity concentration than p, and p$^-$ has a relatively lower p-type impurity concentration than p. Note that, an n$^+$-type and an n$^-$-type will be also simply referred to as an n-type, and a p$^+$-type and a p$^-$-type will be also simply referred to as a p-type.

(First Embodiment)

A semiconductor device of the present embodiment includes a SiC layer having a surface inclined at an angle of 0° to 10° with respect to a{000-1} face, a gate electrode, a gate insulating layer provided between the surface and the gate electrode, and a region, in which a maximum concentration of deuterium (D) is $1 \times 10^{20}$ cm$^{-3}$ or more and a maximum concentration of hydrogen (H) is $1 \times 10^{19}$ cm$^{-3}$ or less, provided between the surface and the gate insulating layer.

Hereinafter, the above region will be referred to as an interface region for convenience sake.

Figure 1:
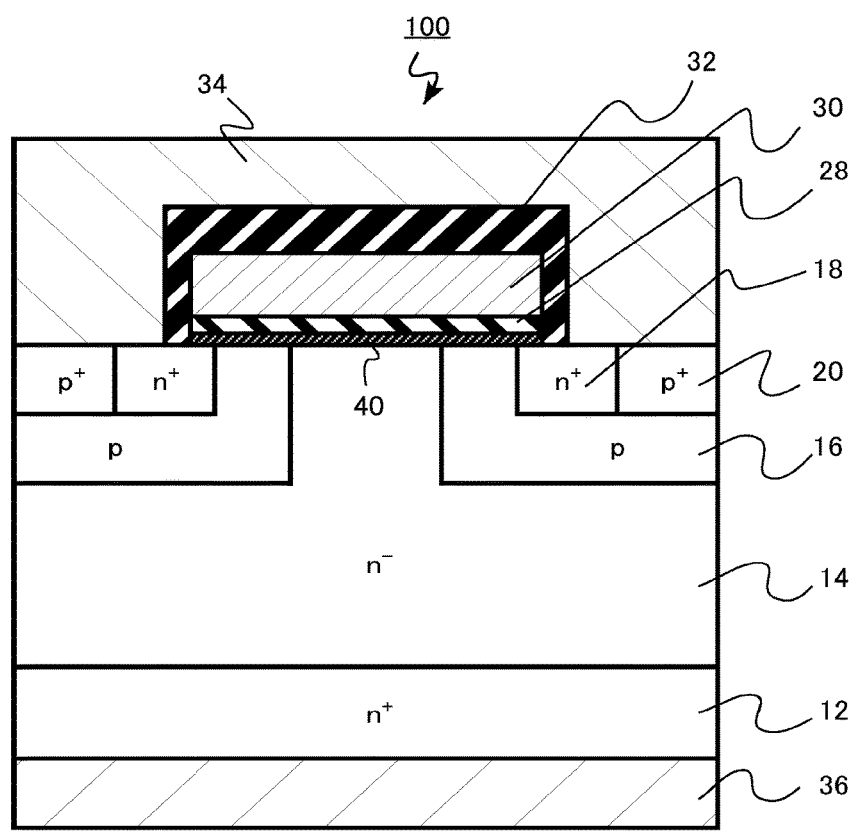
FIG. 1 is a schematic sectional view illustrating a semiconductor device of a first embodiment.

FIG. 1 is a schematic sectional view illustrating a MISFET that is the semiconductor device of the present embodiment. A MISFET 100 is a double implantation MOSFET (DIMOSFET) that forms a p-well region and a source region by ion implantation.

The MISFET 100 includes an n$^+$-type SiC substrate 12 having a first face and a second face. In FIG. 1, the first face is an upper face of the diagram, and the second face is a lower face of the diagram.

The SiC substrate 12 is a 4H—SiC substrate including, for example, nitrogen (N) as an n-type impurity, and the impurity concentration is, for example, $1 \times 10^{18}$ cm$^{-3}$ or more and $1 \times 10^{20}$ cm$^{-3}$ or less.

Figure 2:
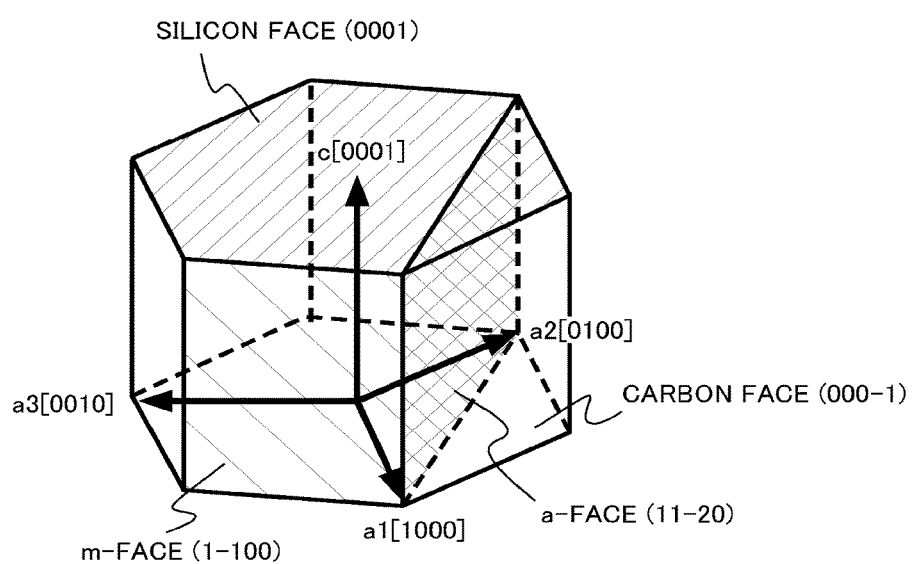
FIG. 2 is a diagram illustrating a crystal structure of SiC of the first embodiment.

FIG. 2 is a diagram illustrating a crystal structure of SiC. The representative crystal structure of SiC is a hexagonal crystal system, such as 4H—SiC. A face having a c-axis along the axial direction of the hexagonal prism as a normal line (the top face of the hexagonal prism) is a (0001) face. The face equivalent to the (0001) face is referred to as a silicon face (Si-face) and indicated as a {0001} face. Silicon (Si) atoms are arranged on the silicon face.

The other face having the c-axis along the axial direction of the hexagonal prism as the normal line (the top face of the hexagonal prism) is a (000-1) face. The face equivalent to the (000-1) face is referred to as a carbon face (C-face) and indicated as a {000-1} face. Carbon (C) atoms are arranged on the carbon face.

Meanwhile, a side face (prismatic face) of the hexagonal prism is an m-face equivalent to a (1-100) face, that is, a {1-100} face. Furthermore, a face passing a pair of edge lines that are not adjacent to each other is an a-face equivalent to a (11-20) face, that is, a {11-20} face. The normal line directions of the m-face and the a-face are perpendicular to the <000-1> direction. Both silicon (Si) atoms and carbon (C) atoms are arranged on the m-face and the a-face.

Hereinafter, a case will be described where the first face of the SiC substrate 12 is inclined at an angle of 0° to 10° with respect to the carbon face, and the second face is inclined at an angle of 0° to 10° with respect to the silicon face. The face inclined at an angle of 0° to 10° with respect to the carbon face and the face inclined at an angle of 0° to 10° with respect to the silicon face are respectively can be regarded equivalent to the carbon face and the silicon face in terms of characteristics.

An n⁻-type drift layer (SiC layer) 14, in which the impurity concentration of the n-type impurity is, for example, $1\times10^{15}$ cm$^{-3}$ or more and $1\times10^{17}$ cm$^{-3}$ or less, is formed on the first face of the SiC substrate 12. The drift layer 14 is, for example, a SiC epitaxial growth layer formed on the SiC substrate 12 by the epitaxial growth.

The surface of the drift layer 14 is inclined at an angle of 0° to 10° with respect to the carbon face. The layer thickness of the drift layer 14 is, for example, 5 μm or more and 100 μm or less.

A p-type p-well region 16, in which the impurity concentration of the p-type impurity is, for example, $5\times10^{15}$ cm$^{-3}$ or more and $1\times10^{18}$ cm$^{-3}$ or less, is formed on a part of the surface of the drift layer 14. The depth of the p-well region 16 is, for example, about 0.6 μm. The p-well region 16 functions as a channel region of the MISFET 100.

An n⁺-type source region 18, in which the impurity concentration of the n-type impurity is, for example, $1\times10^{18}$ cm$^{-3}$ or more and $1\times10^{22}$ cm$^{-3}$ or less, is formed on a part of the surface of the p-well region 16. The depth of the source region 18 is shallower than that of the p-well region 16 and, for example, about 0.3 μm.

Furthermore, a p⁺-type p-well contact region 20, in which the impurity concentration of the p-type impurity is, for example, $1\times10^{18}$ cm$^{-3}$ or more and $1\times10^{22}$ cm$^{-3}$ or less, is formed on a part of the surface of the p-well region 16 that is a side of the source region 18. The depth of the p-well contact region 20 is shallower than that of the p-well region 16 and, for example, about 0.3 μm.

The MISFET 100 includes a gate insulating layer 28 that is continuously formed on the surfaces of the drift layer 14 and the p-well regions 16 and covers over the layer and the regions. The gate insulating layer 28 is formed on the surface inclined at an angle of 0° to 10° with respect to the {000-1} face.

For example, a silicon oxide film or a high-k insulating film is applicable to the gate insulating layer 28. In order to suppress the leakage current of the gate insulating layer 28, a silicon oxide film having a larger band gap than a high-k insulating film is preferably applied.

Furthermore, a gate electrode 30 is formed on the gate insulating layer 28. For example, doped polysilicon or the like is applicable to the gate electrode 30. An interlayer insulating film 32 formed by, for example, a silicon oxide film is formed on the gate electrode 30.

The p-well region 16 below the gate electrode 30 and between the source region 18 and the drift layer 14 functions as a channel region of the MISFET 100.

The gate insulating layer 28 is provided between the gate electrode 30 and the drift layer 14. Furthermore, an interface region 40 is provided on the interface between the drift layer 14 and the gate insulating layer 28. The interface region 40 includes deuterium (D). The maximum concentration of deuterium (D) in the interface region 40 is $1\times10^{20}$ cm$^{-3}$ or more. The maximum concentration of deuterium (D) in the interface region 40 is preferably $1\times10^{21}$ cm$^{-3}$ or more. The maximum concentration of deuterium (D) in the interface region 40 is, for example, $5\times10^{2}$ cm$^{-3}$ or less.

Furthermore, the maximum concentration of hydrogen (H) in the interface region 40 is $1\times10^{19}$ cm$^{-3}$ or less. The maximum concentration of hydrogen (H) in the interface region 40 is preferably $1\times10^{18}$ cm$^{-3}$ or less.

Deuterium segregates on the interface between, for example, the drift layer 14 and the gate insulating layer 28. For example, the concentration distribution of deuterium in the interface region 40 has a peak. The full width at half maximum of the peak of deuterium is preferably 10 nm or less.

The concentration of deuterium or hydrogen in the interface region 40 can be measured by the secondary ion mass spectrometry (SIMS). In the SIMS measurement, SiC is used as a sensitivity reference to measure concentration of an element in the interface region 40.

Deuterium in the interface region 40 is bonded to a dangling bond in the top layer of the drift layer (SiC layer) 14 and forms a termination structure. Deuterium is energetically stable by existing in the interface.

The MISFET 100 includes a conductive source electrode 34 to be electrically connected to the source region 18 and the p-well contact region 20. The source electrode 34 also functions as a p-well electrode that applies a potential to the p-well region 16.

The source electrode 34 is constituted by a stack of, for example, a nickel (Ni) barrier metal layer and an aluminum (Al) metal layer on the barrier metal layer. The Ni barrier metal layer and the Al metal layer may form an alloy by a reaction.

Furthermore, a conductive drain electrode 36 is formed on one side of the SiC substrate 12 that is the opposite side of the drift layer 14, that is, on the second face side. The drain electrode 36 is constituted by a stack of, for example, a nickel (Ni) barrier metal layer and an aluminum (Al) metal layer on the barrier metal layer. The Ni barrier metal layer and the Al metal layer may form an alloy by a reaction.

Note that, in the present embodiment, the n-type impurity is preferably, for example, nitrogen (N) or phosphorus (P), but arsenic (As) or antimony (Sb) is also applicable. Furthermore, the p-type impurity is preferably, for example, aluminum (Al), but boron (B), gallium (Ga), indium (In) or the like is also applicable.

Next, a first method for manufacturing the semiconductor device of the present embodiment will be described. The first manufacturing method includes forming a gate insulating layer on a surface of a SiC layer having the surface inclined at an angle of 0° to 10° with respect to the {000-1} face, performing first heat treatment in an atmosphere containing deuterium after forming the gate insulating layer, and forming a gate electrode on the gate insulating layer after the first heat treatment.

FIGS. 3 to 6 are schematic sectional views illustrating a semiconductor device during a manufacturing process in a method for manufacturing the semiconductor device of the present embodiment.

First, the n$^+$-type SiC substrate 12 having the first face inclined at an angle of 0° to 10° with respect to the carbon face and the second face inclined at an angle of 0° to 10° with respect to the silicon face is prepared. Next, the n$^-$-type drift layer (SiC layer) 14 is formed on the first face of the SiC substrate 12 by the epitaxial growth method. The surface of the drift layer 14 is inclined at an angle of 0° to 10° with respect to the carbon face.

Figure 3:
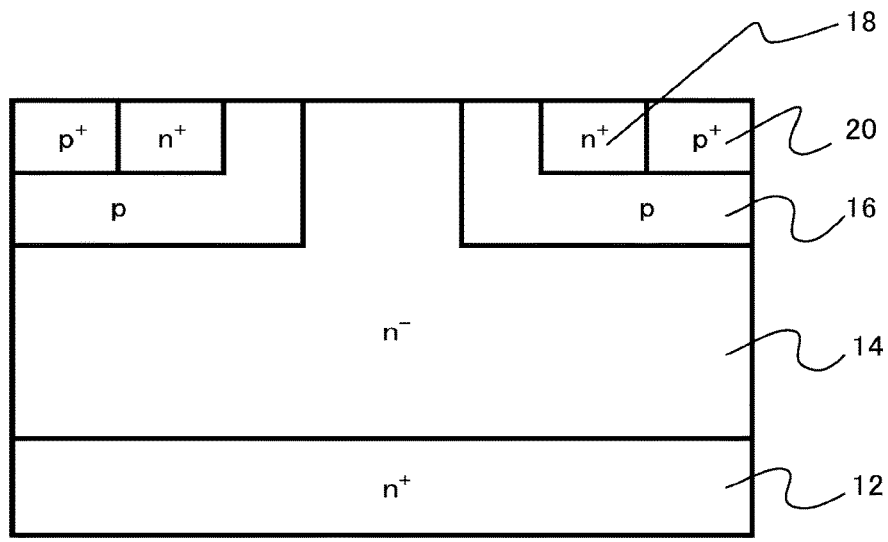
FIG. 3 is a schematic sectional view illustrating a semiconductor device during a manufacturing process in a first method of the first embodiment.

Next, the p-type p-well region 16, the n$^+$-type source region 18, and the p$^-$-type p-well contact region 20 are formed by a known photolithography method and ion implantation method (FIG. 3).

Figure 4:
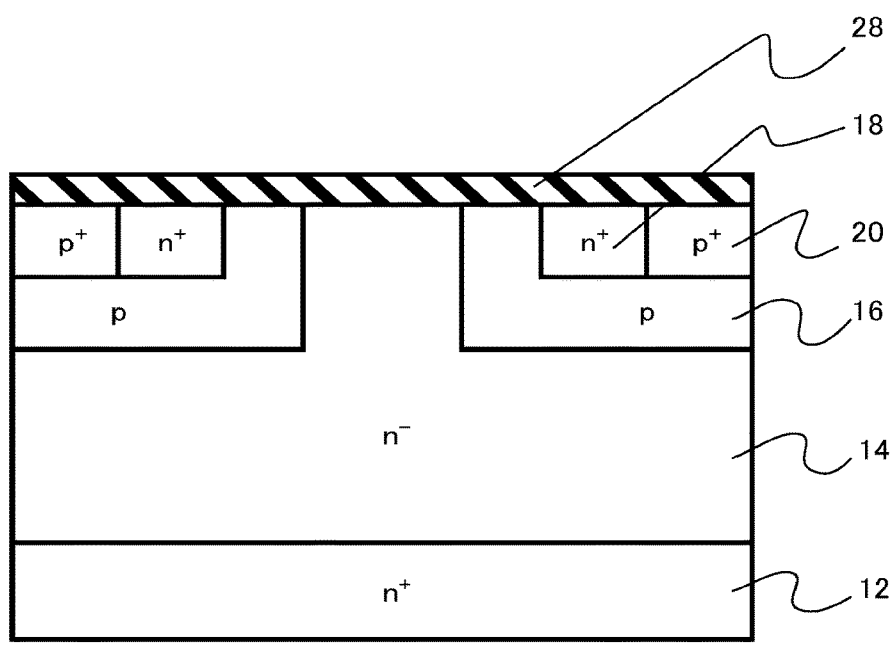
FIG. 4 is a schematic sectional view illustrating a semiconductor device during a manufacturing process in the first method.

Next, the gate insulating layer 28 is formed on the surface of the n$^-$-type drift layer (SiC layer) 14 (FIG. 4). The gate insulating layer 28 is, for example, a silicon oxide film deposited by a low pressure chemical vapor deposition (LPCVD) method. The gate insulating layer 28 may be a thermal oxide film formed by a thermal oxidation method.

After forming the gate insulating layer 28, annealing may be performed to densify the gate insulating layer 28. The annealing is performed, for example, under an atmosphere of inert gas, such as nitrogen or argon, at a temperature of 1000° C. to 1300° C.

Next, after forming the gate insulating layer 28, annealing (first heat treatment) is performed in an atmosphere containing deuterium. The annealing is performed, for example, in a deuterium 100% atmosphere at a temperature of 900° C. to 1200° C. In order to heighten the deuterium concentration in the interface region 40, the annealing temperature is preferably 900° C. or more.

Figure 5:
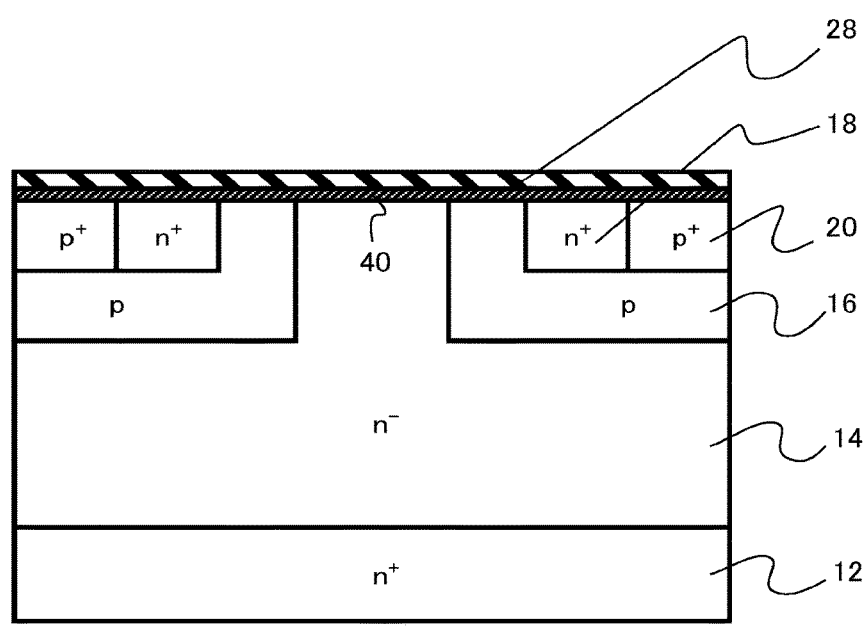
FIG. 5 is a schematic sectional view illustrating a semiconductor device during a manufacturing process in the first method.

Deuterium introduced into the gate insulating layer 28 by the annealing segregates on the interface between the drift layer 14 and the gate insulating layer 28 and forms the interface region 40 (FIG. 5). More specifically, deuterium is bonded to the dangling bond in the interface between the drift layer 14 and the gate insulating layer 28 and distributed in the interface at a high concentration.

Figure 6:
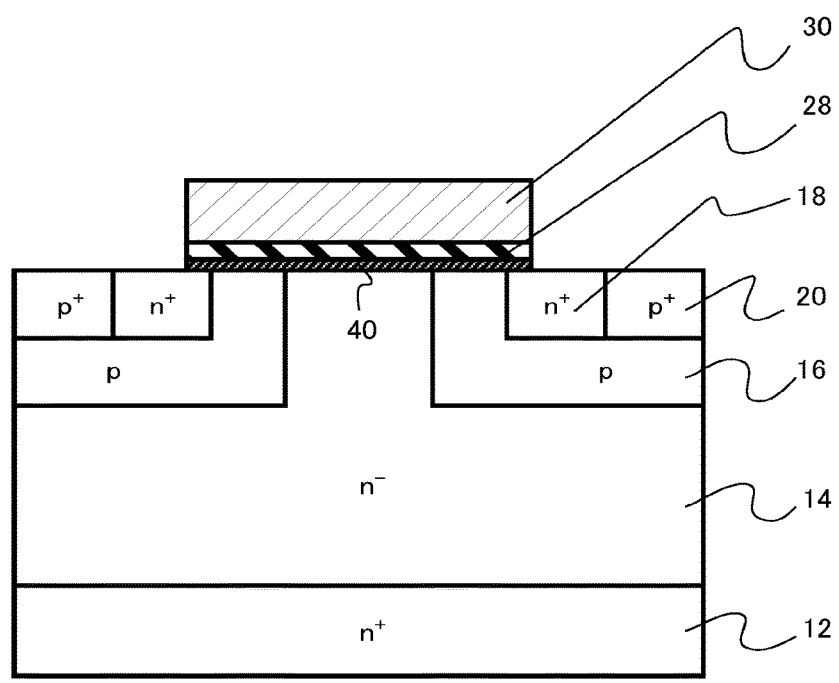
FIG. 6 is a schematic sectional view illustrating a semiconductor device during a manufacturing process in the first method.

Next, the gate electrode 30 is formed on the gate insulating layer 28 by a known process (FIG. 6). The gate electrode 30 is, for example, doped polysilicon formed by the LPCVD method.

Thereafter, the interlayer insulating film 32, the source electrode 34, and the drain electrode 36 are formed by a known process, and the MISFET 100 of the present embodiment illustrated in FIG. 1 is manufactured.

Note that, after forming the interface region 40 by the annealing in the atmosphere containing deuterium, second heat treatment of 800° C. or more is performed. The second heat treatment is, for example, activation annealing to activate a dopant of doped polysilicon. The second heat treatment is, for example, silicide annealing in the case where the source electrode 34 or the drain electrode 36 is formed with silicide. Moreover, the second heat treatment is, for example, the annealing to densify the interlayer insulating film 32. The second heat treatment is performed, for example, at 1000° C. or more and 1200° C. or less.

Next, a second method for manufacturing the semiconductor device of the present embodiment will be described. The second manufacturing method includes forming a gate insulating layer on a surface of a SiC layer having the surface inclined at an angle of 0° to 10° with respect to a {000-1} face by thermally-oxidizing the surface in an atmosphere containing deuterium and oxygen, and forming a gate electrode on the gate insulating layer.

Figure 7:
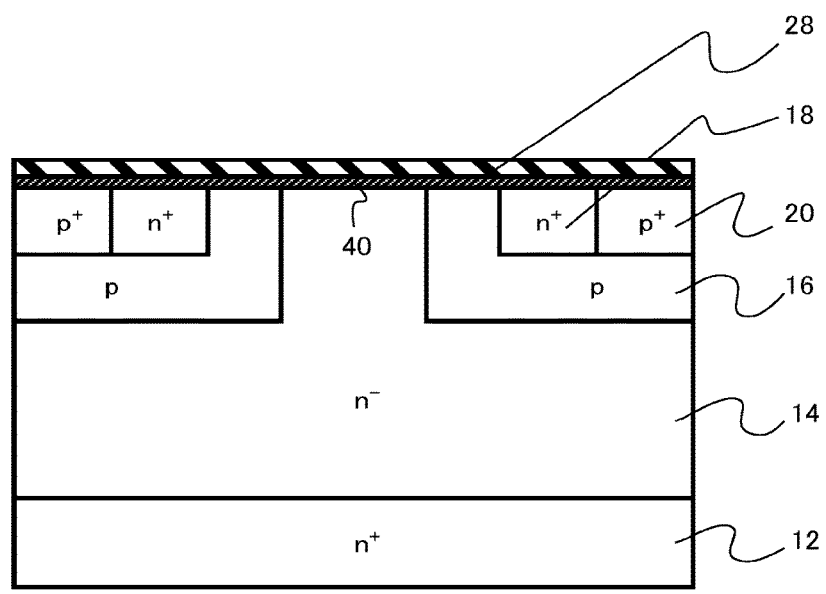
FIG. 7 is a schematic sectional view illustrating a semiconductor device during a manufacturing process in a first method of the second embodiment.

FIG. 7 is a schematic sectional view illustrating a semiconductor device during a manufacturing process in the method for manufacturing the semiconductor device of the present embodiment.

First, the n$^+$-type SiC substrate 12 having the first face inclined at an angle of 0° to 10° with respect to the carbon face and the second face inclined at an angle of 0° to 10° with respect to the silicon face is prepared. Next, the n$^-$-type drift layer (SiC layer) 14 is formed on the first face of the SiC substrate 12 by the epitaxial growth method. The surface of the drift layer 14 is inclined at an angle of 0° to 10° with respect to the carbon face.

Next, the p-type p-well region 16, the n$^+$-type source region 18, and the p$^+$-type p-well contact region 20 are formed by a known photolithography method and ion implantation method.

Next, the surface of the n$^-$-type drift layer (SiC layer) 14 is thermally oxidized in the atmosphere containing deuterium and oxygen. For example, the surface of the drift layer 14 is thermally oxidized in an atmosphere of heavy water steam ($D_2O$). The oxidation temperature is, for example, 800° C. or more and 1200° C. or less. In order to heighten the deuterium concentration in the interface region 40, the oxidation temperature is preferably 900° C. or more.

With the thermal oxidation, the gate insulating layer 28 is formed. Deuterium segregates on the interface between the drift layer 14 and the gate insulating layer 28 and forms the interface region 40 (FIG. 7). More specifically, deuterium in the atmosphere is bonded to the dangling bond in the interface between the drift layer 14 and the gate insulating layer 28 and distributed in the interface at a high concentration.

Note that, the gate insulating layer 28 may be formed by further depositing an insulating film after thermally oxidizing the surface. The insulating film in this case is, for example, a silicon oxide film deposited by the LPCVD method.

Next, the gate electrode 30 is formed on the gate insulating layer 28 by a known process. The gate electrode 30 is, for example, doped polysilicon formed by the LPCVD method.

Thereafter, the interlayer insulating film 32, the source electrode 34, and the drain electrode 36 are formed by a known process, and the MISFET 100 of the present embodiment illustrated in FIG. 1 is manufactured.

Hereinafter, the function and effect of the semiconductor device of the present embodiment will be described.

In the MIS structure using SiC, one of the causes that the high mobility cannot be achieved is that the dangling bond in the interface is not terminated and the interface state is formed.

In the present embodiment, the dangling bond in the interface between the SiC layer and the gate insulating layer is terminated with deuterium. The interface state in the MIS structure is reduced accordingly, and the high mobility is obtained at a channel portion. Consequently, the MISFET 100 having low on-resistance can be achieved.

Deuterium with which the dangling bond is terminated is hardly desorbed in subsequent high-temperature heat treatment or applying a high electric field later. In other words, deuterium with which the dangling bond is terminated has high heat resistance and electrical stress resistance.

Consequently, the MISFET 100 having small characteristic variation and high reliability can be implemented in comparison with, for example, the case where the dangling bond is terminated with hydrogen.

Furthermore, by reducing the concentration of hydrogen, which is easily desorbed in the high-temperature heat treatment or applying the high electric field, in the interface region, the MISFET 100 having small characteristic variation and high reliability can be implemented in the present embodiment.

Figure 8:
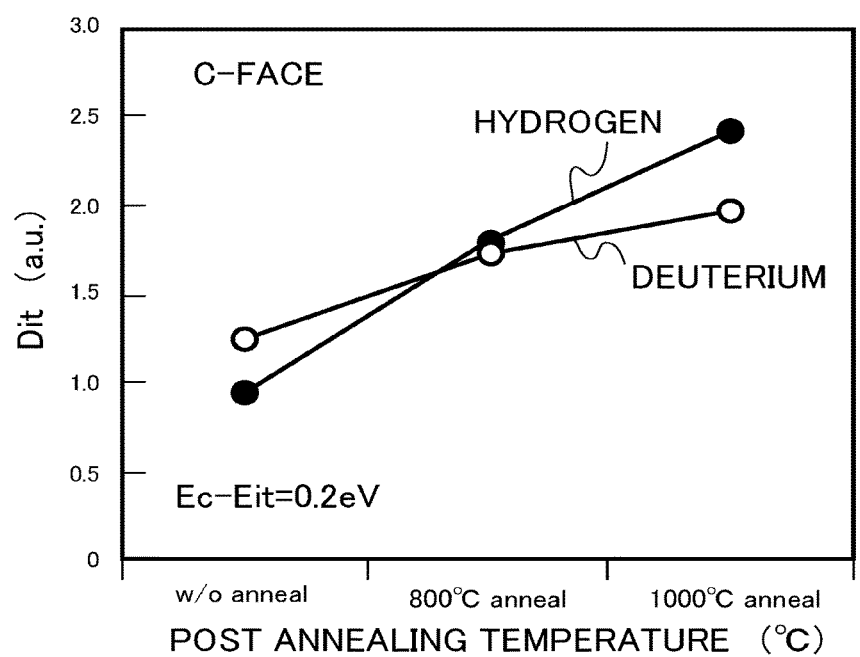
FIG. 8 is a graph for explaining a function and an effect of the first embodiment.
Figure 9:
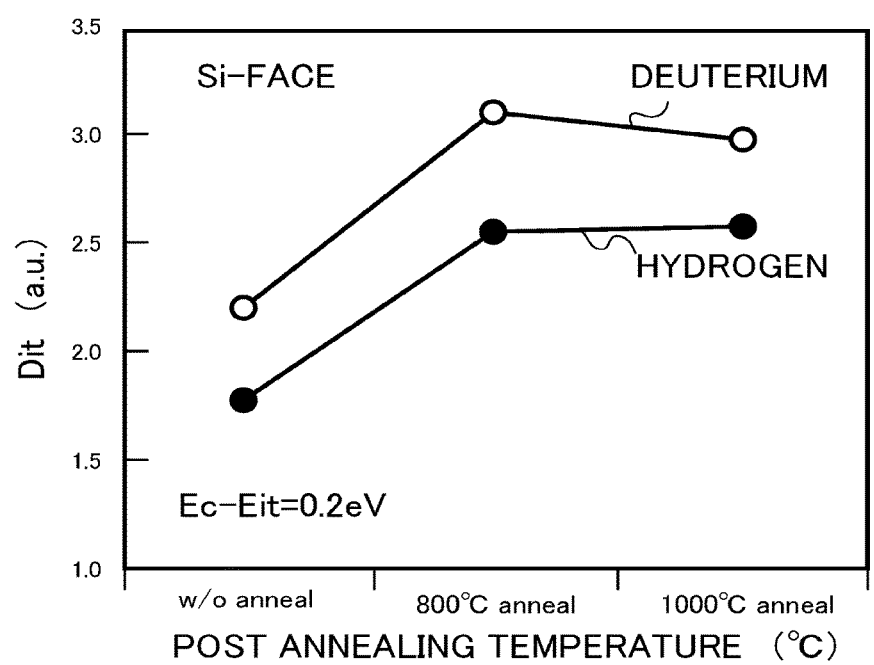
FIG. 9 is a graph for explaining a function and an effect of the first embodiment.

FIGS. 8 and 9 are graphs for explaining the function and effect of the present embodiment. FIGS. 8 and 9 are measurement results of the area density of the interface state in the MIS structure. The area density illustrated in FIGS. 8 and 9 is the area density at a shallow level where the energy level (Ec−Eit) from a conduction band edge is 0.2 eV. It is considered that there is a strong correlation between the mobility and the area density of the interface state at the shallow energy level from the conduction band edge.

FIG. 8 illustrates the case of the C-face, and FIG. 9 illustrates the case of the Si-face. The cases where the C-face and the Si-face are annealed, after depositing a 50 nm silicon oxide film, in a deuterium atmosphere at 900° C. and in a hydrogen atmosphere are illustrated at 900° C. Furthermore, whether or not annealing after forming the interface region (post annealing) is performed and the annealing temperature are used as parameters in both cases.

As illustrated in FIG. 8, when the C-face is annealed at 1000° C., the area density of deuterium of the interface state is lower than that of hydrogen. It is considered that this is because the bond between deuterium and the dangling bond is stronger than that between hydrogen and the dangling bond, and is hardly cleaved by heat.

In contrast, as illustrated in FIG. 9, there is no distinct difference in the correlation between the area density of the interface state and a post annealing condition in the cases of deuterium and hydrogen on the Si-face. From the above results, the termination of the interface with deuterium is effective, especially, on the C-face. It is considered that the reason is that the bond between deuterium and carbon is stronger than that between hydrogen and carbon, and has high heat resistance.

Figure 10:
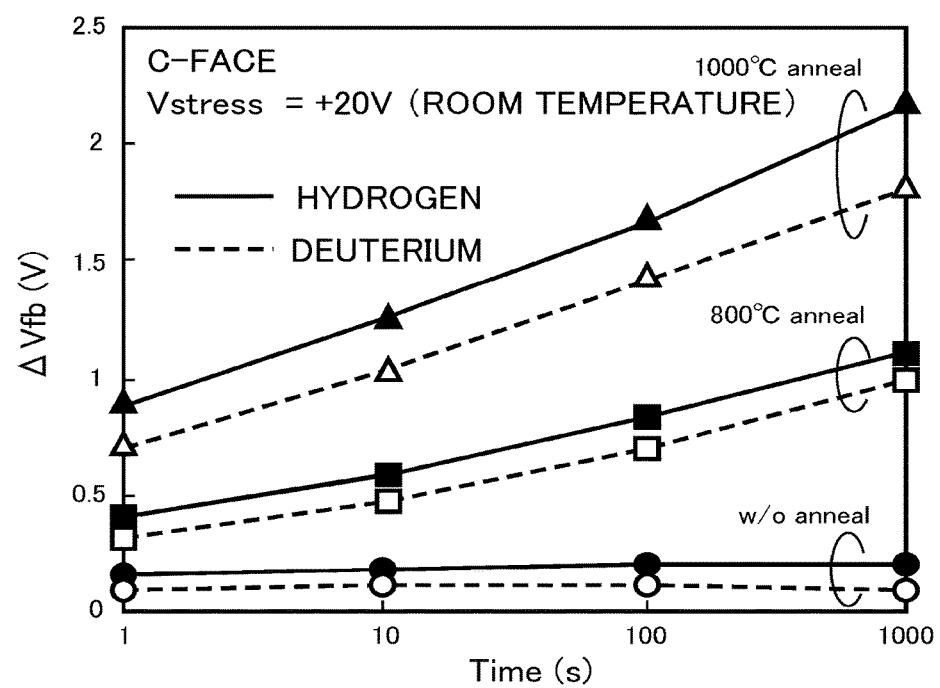
FIG. 10 is a graph for explaining a function and an effect of the first embodiment.

FIG. 10 is a graph for explaining the function and effect of the present embodiment. The shift amount of the flat band voltage (Vfb) after applying electrical stress to the MIS structure is indicated. The cases where the C-face is annealed in a deuterium atmosphere and in a hydrogen atmosphere are illustrated. The applied time of the electrical stress is used as a parameter. Furthermore, the cases where the C-face is not annealed after forming the interface region (post annealed), and the annealing temperatures are 800° C. and 1000° C. are illustrated. The applied voltage is +20V with respect to the gate electrode, and the face of SiC is the C-face.

There is a difference between deuterium and hydrogen in the shift amounts of the flat band voltage, especially, when a stress is applied for a long time. It is considered that the bond between deuterium and the dangling bond is stronger than that between hydrogen and the dangling bond, and is hardly cut by the electrical stress. From the above description, the bond between deuterium and carbon is stronger than that between hydrogen and carbon, and has high electrical stress resistance.

Note that, in the present embodiment, the maximum concentration of deuterium (D) in the interface region 40 is $1\times10^{20}$ cm$^{-3}$ or more. The area density of the interface state of the interface between the SiC layer and the silicon oxide film (@Ec−Eit=0.2 eV) is normally about $1\times10^{12}$ cm$^{-2}$. In order to reduce the interface state at the termination with deuterium, it is considered that deuterium more than the area density preferably exists.

When it is assumed that deuterium in an amount equivalent to the area density is distributed in the 1 nm thick interface region 40, the concentration of deuterium is $1\times10^{19}$ cm$^{-3}$. In order to sufficiently terminate the dangling bond, the maximum concentration of deuterium in the interface region 40 is preferably $1\times10^{20}$ cm$^{-3}$ or more. Furthermore, in order to further reduce the interface state, the maximum concentration of deuterium in the interface region 40 is preferably $1\times10^{21}$ cm$^{-3}$ or more.

Note that, in the present embodiment, the maximum concentration of hydrogen (H) in the interface region 40 and the gate insulating layer 28 is $1\times10^{19}$ cm$^{-3}$ or less. As described above, the bond between hydrogen and the dangling bond is weaker than that between deuterium and the dangling bond, and hydrogen in the interface is easily desorbed by the high-temperature heat treatment or the electrical stress. The same applies to hydrogen in the insulating film. In the present embodiment, by the high-temperature deuterium treatment and the post-annealing thereafter, it is possible to reduce the maximum concentration of hydrogen (H) in the interface region 40 and the gate insulating layer 28 while deuterium is being bonded to the dangling bond. Consequently, it is possible to suppress the characteristic variation of the MISFET 100 due to desorption of hydrogen from the interface and the insulating film.

As described above, according to the present embodiment, the interface state between the SiC layer and the gate insulating layer is reduced, and the MISFET 100 having high mobility can be implemented. Furthermore, by applying deuterium strongly bonded to carbon to the termination structure and suppressing the hydrogen amount in the interface region, the MISFET 100 having high reliability can be implemented.

(Second Embodiment)

A semiconductor device of the present embodiment is similar to that of the first embodiment except that a SiC layer has a surface, a normal line direction of which is inclined at an angle of 80° to 90° with respect to a <000-1> direction. Thus, the description overlapping with the first embodiment will be omitted.

Figure 11:
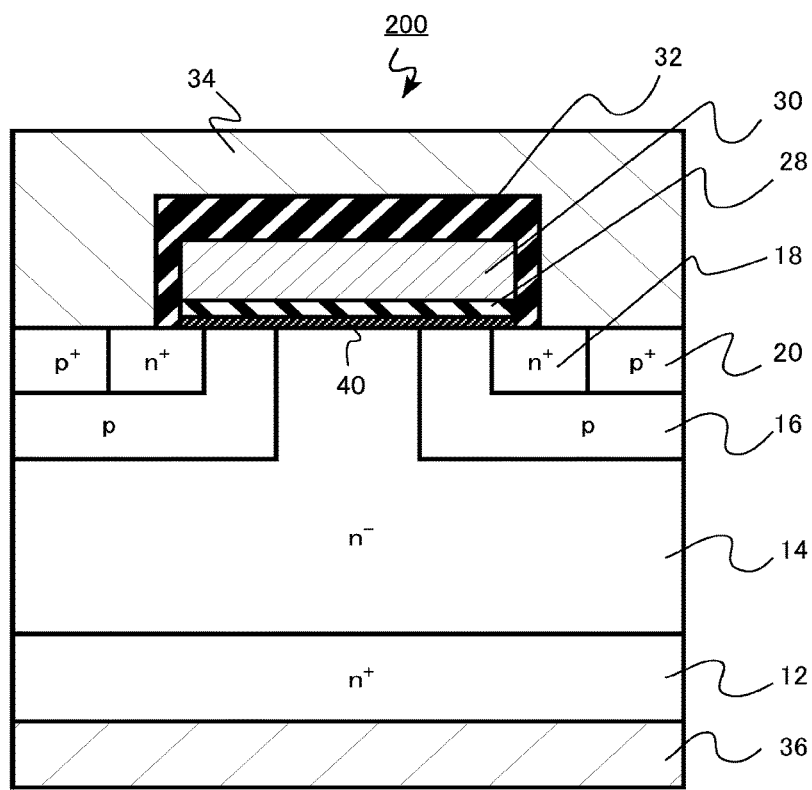
FIG. 11 is a schematic sectional view illustrating a semiconductor device of a second embodiment.

FIG. 11 is a schematic sectional view illustrating a MISFET that is the semiconductor device of the present embodiment. A MISFET 200 is a DIMOSFET that forms a p-well region and a source region by ion implantation.

In the MISFET 200 of the present embodiment, the normal line directions of a first face of a SiC substrate 12 and a surface of a drift layer 14 are inclined at an angle of 80° to 90° with respect to the <000-1> direction. For example, the first face of the SiC substrate 12 and the surface of the drift layer 14 are inclined at an angle of 0° to 10° with respect to a {1-100} face (m-face) or a {11-20} face (a-face).

The interface region 40 includes deuterium (D). The maximum concentration of deuterium (D) in the interface region 40 is $1\times10^{20}$ cm$^{-3}$ or more. Furthermore, the maximum concentration of hydrogen (H) in the interface region 40 is $1\times10^{19}$ cm$^{-3}$ or less.

Both silicon (Si) atoms and carbon (C) atoms are arranged on the surface, the normal direction of which is inclined at an angle of 80° to 90° with respect to the <000-1> direction, of the drift layer 14. By bonding deuterium to carbon on the surface, the interface state is reduced.

According to the present embodiment, the interface state between the SiC layer and the gate insulating layer is reduced, and the MISFET having high mobility can be implemented similarly to the first embodiment. Furthermore, by applying deuterium strongly bonded to carbon to the termination structure and suppressing the hydrogen amount in the interface region, the MISFET 200 having high reliability can be implemented.

(Third Embodiment)

A semiconductor device of the present embodiment is different from that of the first embodiment in that the semiconductor device is a trench gate-type MISFET. The description overlapping with the first embodiment will be omitted.

Figure 12:
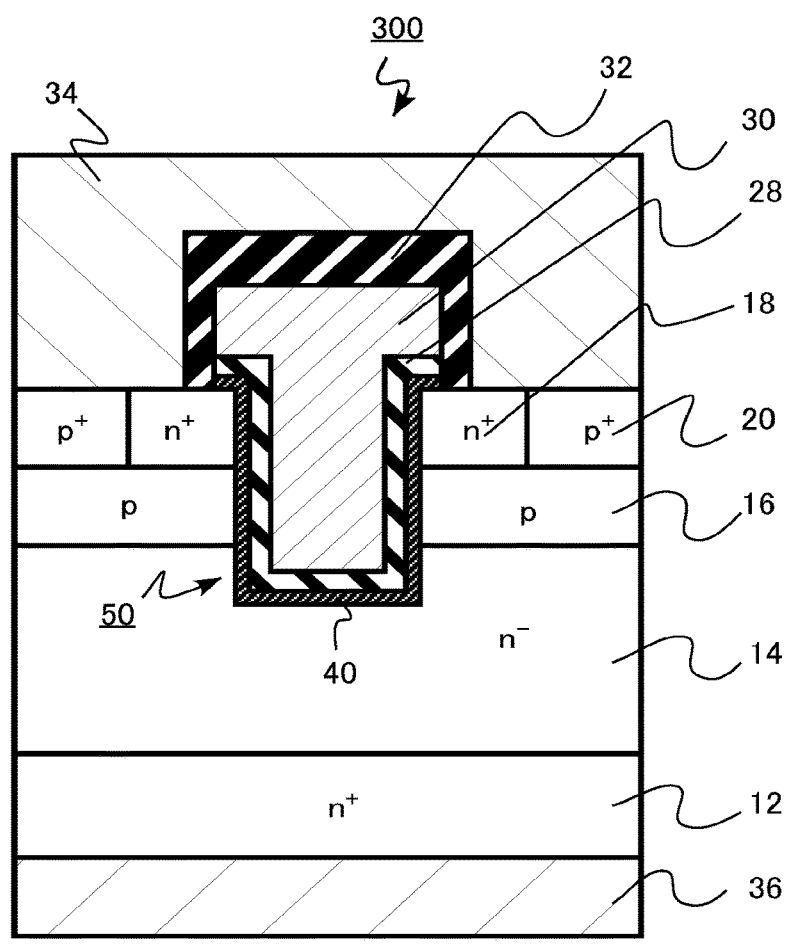
FIG. 12 is a schematic sectional view illustrating a semiconductor device of a third embodiment.

FIG. 12 is a schematic sectional view illustrating a MISFET that is the semiconductor device of the present embodiment. A MISFET 300 is a trench gate-type MISFET in which a gate insulating layer and a gate electrode are provided in a trench.

The MISFET 300 includes an n$^+$-type SiC substrate 12 having a first face and a second face. In FIG. 12, the first face is an upper face of the diagram, and the second face is a lower face of the diagram. The first face of the SiC substrate 12 is inclined at an angle of 0° to 10° with respect to a silicon face, and the second face is inclined at an angle of 0° to 10° with respect to a carbon face.

The SiC substrate 12 is a 4H—SiC substrate including, for example, nitrogen (N) as an n-type impurity, and the impurity concentration is, for example, $1 \times 10^{18}$ cm$^{-3}$ or more and $1 \times 10^{20}$ cm$^{-3}$ or less.

An n$^-$-type SiC layer (drift layer) 14, in which the impurity concentration of an n-type impurity is, for example, $1 \times 10^{15}$ cm$^{-3}$ or more and $1 \times 10^{17}$ cm$^{-3}$ or less, is formed on the first face of the SiC substrate 12. The drift layer 14 is, for example, an epitaxial growth layer formed on the SiC substrate 12 by the epitaxial growth.

The surface of the drift layer 14 is inclined at an angle of 0° to 10° with respect to the silicon face. The layer thickness of the drift layer 14 is, for example, 5 μm or more and 100 μm or less.

A p-type p-well region 16, in which the impurity concentration of the p-type impurity is, for example, $5 \times 10^{15}$ cm$^{-3}$ or more and $1 \times 10^{18}$ cm$^{-3}$ or less, is formed on a part of the surface of the drift layer 14. The depth of the p-well region 16 is, for example, about 0.6 μm. The p-well region 16 functions as a channel region of the MISFET 300.

An n$^+$-type source region 18, in which the impurity concentration of the n-type impurity is, for example, $1 \times 10^{18}$ cm$^{-3}$ or more and $1 \times 10^{22}$ cm$^{-3}$ or less, is formed on a part of the surface of the p-well region 16. The depth of the source region 18 is shallower than that of the p-well region 16 and, for example, about 0.3 μm.

Furthermore, a p$^+$-type p-well contact region 20, in which the impurity concentration of the p-type impurity is, for example, $1 \times 10^{18}$ cm$^{-3}$ or more and $1 \times 10^{22}$ cm$^{-3}$ or less, is formed on a part of the surface of the p-well region 16 that is a side of the source region 18. The depth of the p-well contact region 20 is shallower than that of the p-well region 16 and, for example, about 0.3 μm.

A trench 50 is provided in the direction from the surface of the drift layer 14 to the SiC substrate 12. The inner wall face of the trench 50 is, for example, the m-face or the a-face.

The MISFET 300 includes a gate insulating layer 28 that is continuously formed on the surfaces of the drift layer 14, the p-well regions 16, and the surfaces of the source regions 18 in the trench 50 and covers over the layer and the regions.

Furthermore, a gate electrode 30 is formed on the gate insulating layer 28. The p-well region 16 between the source region 18 and the drift layer 14 on the side face of the trench 50 functions as a channel region of the MISFET 300.

The gate insulating layer 28 is provided between the gate electrode 30 and the p-well region 16. Furthermore, an interface region 40 is provided on the interface between the p-well region 16 and the gate insulating layer 28. The interface region 40 includes deuterium (D). The maximum concentration of deuterium (D) in the interface region 40 is $1 \times 10^{20}$ cm$^{-3}$ or more. Furthermore, the maximum concentration of hydrogen (H) in the interface region 40 is $1 \times 10^{19}$ cm$^{-3}$ or less.

The MISFET 300 includes a conductive source electrode 34 to be electrically connected to the source region 18 and the p-well contact region 20. The source electrode 34 also functions as a p-well electrode that applies a potential to the p-well region 16. Furthermore, a conductive drain electrode 36 is formed on one side of the SiC substrate 12 that is the opposite side of the drift layer 14, that is, on the second face side.

According to the present embodiment, similar effects as the first and the second embodiments can be obtained due to the existence of the interface region 40. Furthermore, by employing a trench gate structure, it is possible to improve integration degree of the MISFET 300. Moreover, by removing the JFET region, it is possible to reduce conduction losses, and the MISFET 300 having small on-resistance can be implemented.

(Fourth Embodiment)

A semiconductor device of the present embodiment is similar to that of the first embodiment except that the semiconductor device is not a MISFET but an IGBT. Thus, the description overlapping with the first embodiment will be omitted.

Figure 13:
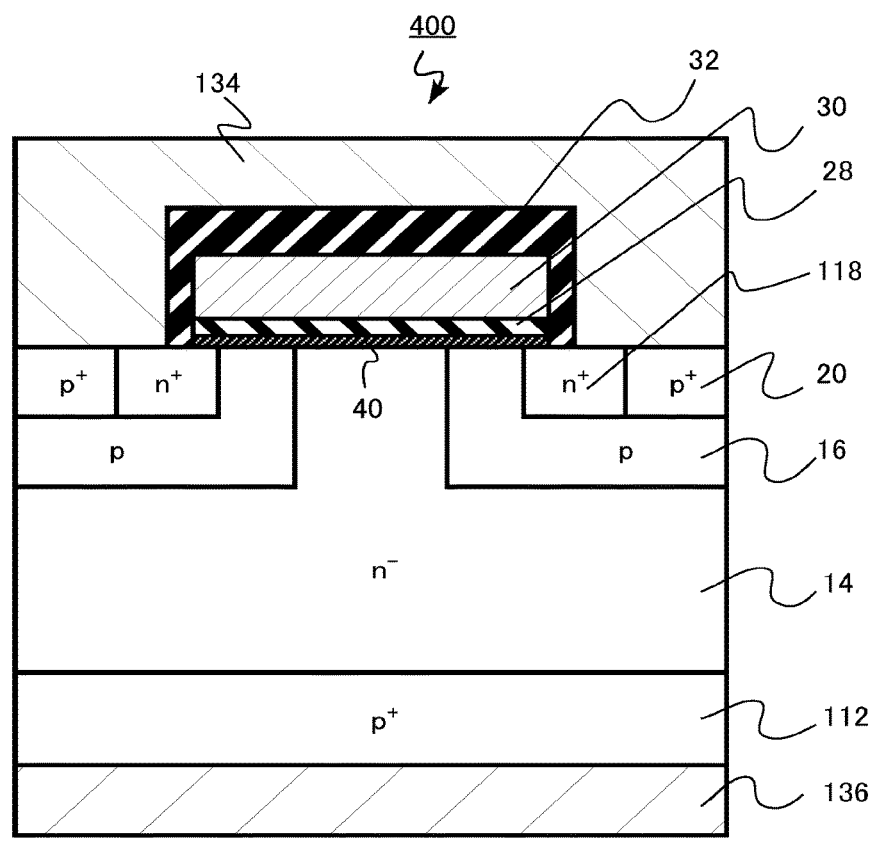
FIG. 13 is a schematic sectional view illustrating a semiconductor device of a fourth embodiment.

FIG. 13 is a schematic sectional view illustrating an IGBT that is the semiconductor device of the present embodiment.

An IGBT 400 includes a p$^+$-type SiC substrate 112 having a first face and a second face. In FIG. 13, the first face is an upper face of the diagram, and the second face is a lower face of the diagram.

The SiC substrate 112 is a 4H—SiC substrate, in which the impurity concentration is, for example, $1 \times 10^{18}$ cm$^{-3}$ or more and $1 \times 10^{20}$ cm$^{-3}$ or less, including, for example, aluminum (Al) as a p-type impurity.

Hereinafter, a case will be described where the first face of the SiC substrate 112 is inclined at an angle of 0° to 10° with respect to a carbon face, and the second face is inclined at an angle of 0° to 10° with respect to a silicon face. The face inclined at an angle of 0° to 10° with respect to the carbon face and the face inclined at an angle of 0° to 10° with respect to the silicon face are respectively regarded as the carbon face and the silicon face due to the characteristics.

An n$^-$-type drift layer (SiC layer) 14, in which the impurity concentration of the n-type impurity is, for example, $1 \times 10^{14}$ cm$^{-3}$ or more and $1 \times 10^{16}$ cm$^{-3}$ or less, is formed on the first face of the SiC substrate 112. The drift layer 14 is, for example, an epitaxial growth layer formed on the SiC substrate 112 by the epitaxial growth.

The surface of the drift layer 14 is inclined at an angle of 0° to 10° with respect to the carbon face. The layer thickness of the drift layer 14 is, for example, 10 μm or more and 300 μm or less.

On a part of the surface of the drift layer 14, a p-type p-well region 16, in which the impurity concentration of the p-type impurity is, for example, $5 \times 10^{15}$ cm$^{-3}$ or more and $1 \times 10^{17}$ cm$^{-3}$ or less, is formed. The depth of the p-well region 16 is, for example, about 0.6 µm. The p-well region 16 functions as a channel region of the IGBT 400.

On a part of the surface of the p-well region 16, an n+-type emitter region 118, in which the impurity concentration of the n-type impurity is, for example, $1\times10^{18}$ cm$^{-3}$ or more and $1\times10^{22}$ cm$^{-3}$ or less, is formed. The depth of the emitter region 118 is shallower than that of the p-well region 16 and, for example, about 0.3 µm.

Furthermore, on a part of the surface of the p-well region 16 that is a side of the emitter region 118, a p+-type p-well contact region 20, in which the impurity concentration of the p-type impurity is, for example, $1\times10^{18}$ cm$^{-3}$ or more and $1\times10^{22}$ cm$^{-3}$ or less, is formed. The depth of the p-well contact region 20 is shallower than that of the p-well region 16 and, for example, about 0.3 µm.

The IGBT 400 includes a gate insulating layer 28 that is continuously formed on the surfaces of the drift layer 14 and the p-well regions 16 and covers over the layer and the regions. For example, a silicon oxide film or a high-k insulating film is applicable to the gate insulating layer 28.

In order to suppress the leakage current of the gate insulating layer 28, a silicon oxide film having a larger band gap than a high-k insulating film is preferably applied.

Furthermore, a gate electrode 30 is formed on the gate insulating layer 28. For example, polysilicon or the like is applicable to the gate electrode 30. An interlayer insulating film 32 formed by, for example, a silicon oxide film is formed on the gate electrode 30.

The p-well region 16 between the emitter region 118 and the drift layer 14 below the gate electrode 30 functions as a channel region of the IGBT 400.

The gate insulating layer 28 is provided between the gate electrode 30 and the drift layer 14. Furthermore, an interface region 40 is provided on the interface between the drift layer 14 and the gate insulating layer 28. The interface region 40 includes deuterium (D). The maximum concentration of deuterium (D) in the interface region 40 is $1\times10^{20}$ cm$^{-3}$ or more. The maximum concentration of deuterium (D) in the interface region 40 is preferably $1\times10^{21}$ cm$^{-3}$ or more. The maximum concentration of deuterium (D) in the interface region 40 is, for example, $5\times10^{22}$ cm$^{-3}$ or less.

Furthermore, the maximum concentration of hydrogen (H) in the interface region 40 is $1\times10^{19}$ cm$^{-3}$ or less. The maximum concentration of hydrogen (H) in the interface region 40 is preferably $1\times10^{18}$ cm$^{-3}$ or less.

Deuterium segregates on the interface between, for example, the drift layer 14 and the gate insulating layer 28. For example, the concentration distribution of deuterium in the interface region 40 has a peak. The full width at half maximum of the peak is preferably 10 nm or less.

The concentration of deuterium or hydrogen in the interface region 40 can be measured by the secondary ion mass spectrometry (SIMS).

Deuterium in the interface region 40 is bonded to a dangling bond in the top layer of the drift layer (SiC layer) 14 and forms a termination structure. Deuterium is energetically stable by existing in the interface.

Furthermore, the IGBT 400 includes a conductive emitter electrode 134 to be electrically connected to the emitter region 118 and the p-well contact region 20. The emitter electrode 134 also functions as a p-well electrode that applies a potential to the p-well region 16.

The emitter electrode 134 is constituted by a stack of, for example, a nickel (Ni) barrier metal layer and an aluminum (Al) metal layer on the barrier metal layer. The Ni barrier metal layer and the Al metal layer may form an alloy by a reaction.

Furthermore, a conductive collector electrode 136 is formed on a side of the SiC substrate 112 that is the opposite side of the drift layer 14, that is, on the second face side. The collector electrode 136 is constituted by a stack of, for example, a nickel (Ni) barrier metal layer and an aluminum (Al) metal layer on the barrier metal layer. The Ni barrier metal layer and the Al metal layer may form an alloy by a reaction.

According to the present embodiment, a similar function and effect as the first embodiment can be obtained due to the existence of the interface region 40. Consequently, the IGBT 400 having high operation performance and high reliability can be implemented.

(Fifth Embodiment)

A semiconductor device of the present embodiment includes a SiC layer having a surface inclined at an angle of 0° to 10° with respect to a {0001} face, a gate electrode, a gate insulating layer provided between the surface and the gate electrode, and a region, in which a maximum concentration of deuterium (D) is $1\times10^{19}$ cm$^{-3}$ or more and a maximum concentration nitrogen (N) or phosphorus (P) is $1\times10^{21}$ cm$^{-3}$ or more, provided between the SiC layer and the gate insulating layer.

Hereinafter, the above region will be referred to as an interface region for convenience sake.

Figure 14:
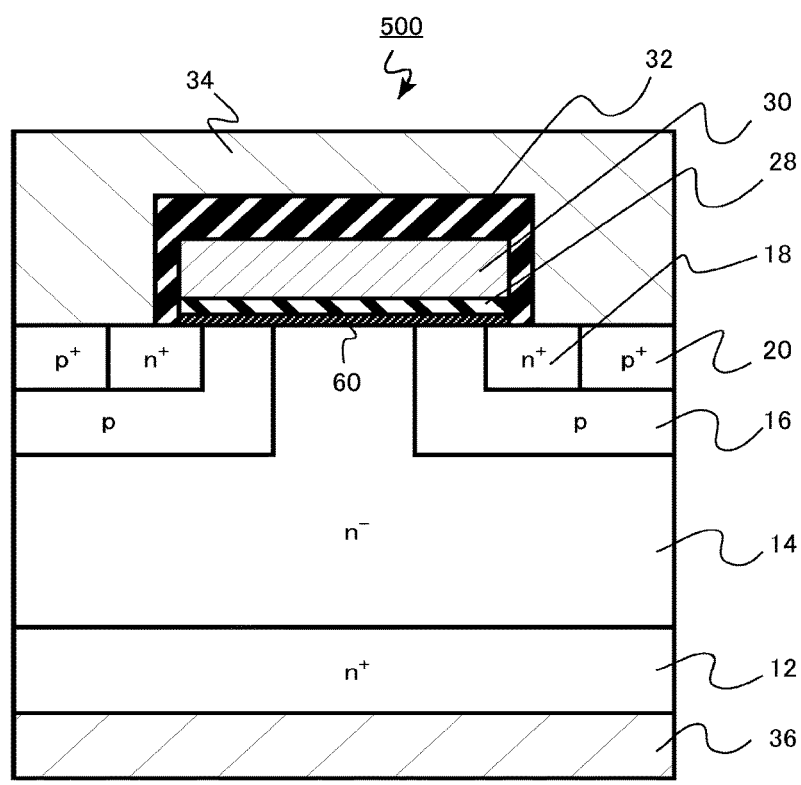
FIG. 14 is a schematic sectional view illustrating a semiconductor device of a fifth embodiment.

FIG. 14 is a schematic sectional view illustrating a MISFET that is the semiconductor device of the present embodiment. A MISFET 500 is a double implantation MOSFET (DIMOSFET) that forms a p-well region and a source region by ion implantation.

The MISFET 500 includes an n+-type SiC substrate 12 having a first face and a second face. In FIG. 14, the first face is an upper face of the diagram, and the second face is a lower face of the diagram.

The SiC substrate 12 is a 4H—SiC substrate including, for example, nitrogen (N) as an n-type impurity, and the impurity concentration is, for example, $1\times10^{18}$ cm$^{-3}$ or more and $1\times10^{20}$ cm$^{-3}$ or less.

Hereinafter, a case will be described where the first face of the SiC substrate 12 is inclined at an angle of 0° to 10° with respect to a silicon face, and the second face is inclined at an angle of 0° to 10° with respect to a carbon face. The face inclined at an angle of 0° to 10° with respect to the silicon face and the face inclined at an angle of 0° to 10° with respect to the carbon face are respectively regarded as the silicon face and the carbon face due to the characteristics.

An n−-type drift layer (SiC layer) 14, in which the impurity concentration of the n-type impurity is, for example, $1\times10^{15}$ or more and $1\times10^{17}$ cm$^{-3}$ or less, is formed on the first face of the SiC substrate 12. The drift layer 14 is, for example, a SiC epitaxial growth layer formed on the SiC substrate 12 by the epitaxial growth.

The surface of the drift layer 14 is also inclined at an angle of 0° to 10° with respect to the silicon face. The layer thickness of the drift layer 14 is, for example, 5 µm or more and 100 µm or less.

A p-type p-well region 16, in which the impurity concentration of the p-type impurity is, for example, $5\times10^{15}$ cm$^{-3}$ or more and $1\times10^{18}$ cm$^{-3}$ or less, is formed on a part of the surface of the drift layer 14. The depth of the p-well region 16 is, for example, about 0.6 µm. The p-well region 16 functions as a channel region of the MISFET 500.

An n+-type source region 18, in which the impurity concentration of the n-type impurity is, for example, $1\times10^{18}$ cm$^{-3}$ or more and $1\times10^{22}$ cm$^{-3}$ or less, is formed on a part of the surface of the p-well region 16. The depth of the source region 18 is shallower than that of the p-well region 16 and, for example, about 0.3 µm.

Furthermore, a p+-type p-well contact region 20, in which the impurity concentration of the p-type impurity is, for example, $1 \times 10^{18}$ cm$^{-3}$ or more and $1 \times 10^{22}$ cm$^{-3}$ or less, is formed on a part of the surface of the p-well region 16 that is a side of the source region 18. The depth of the p-well contact region 20 is shallower than that of the p-well region 16 and, for example, about 0.3 µm.

The MISFET 500 includes a gate insulating layer 28 that is continuously formed on the surfaces of the drift layer 14 and the p-well regions 16 and covers over the layer and the regions. The gate insulating layer 28 is formed on a surface inclined at an angle of 0° to 10° with respect to a {0001} face.

For example, a silicon oxide film or a high-k insulating film is applicable to the gate insulating layer 28. In order to suppress the leakage current of the gate insulating layer 28, a silicon oxide film having a larger band gap than a high-k insulating film is preferably applied.

Furthermore, a gate electrode 30 is formed on the gate insulating layer 28. For example, doped polysilicon or the like is applicable to the gate electrode 30. An interlayer insulating film 32 formed by, for example, a silicon oxide film is formed on the gate electrode 30.

The p-well region 16 between the source region 18 and the drift layer 14 below the gate electrode 30 functions as a channel region of the MISFET 500.

The gate insulating layer 28 is provided between the gate electrode 30 and the drift layer 14. Then, an interface region 60 is provided on the interface between the drift layer 14 and the gate insulating layer 28. The interface region 60 includes deuterium (D). The interface region 60 includes nitrogen (N) or phosphorus (P).

The maximum concentration of deuterium (D) in the interface region 60 is $1 \times 10^{19}$ cm$^{-3}$ or more. The maximum concentration of deuterium (D) in the interface region 60 is preferably $1 \times 10^{20}$ cm$^{-3}$ or more.

The maximum concentration of nitrogen (N) or phosphorus (P) in the interface region 60 is $1 \times 10^{21}$ cm$^{-3}$ or more. The maximum concentration of nitrogen (N) or phosphorus (P) in the interface region 60 is preferably $3 \times 10^{21}$ cm$^{-3}$ or more.

Deuterium, and nitrogen or phosphorus segregate on the interface between, for example, the drift layer 14 and the gate insulating layer 28. For example, the concentration distribution of deuterium, and nitrogen or phosphorus in the interface region 60 has a peak. The full width at half maximum of the peak of deuterium, and nitrogen or phosphorus is preferably 10 nm or less.

The concentration of deuterium, and nitrogen or phosphorus in the interface region 60 can be measured by the secondary ion mass spectrometry (SIMS).

Deuterium, and nitrogen or phosphorus in the interface region 60 is bonded to a dangling bond in the top layer of the drift layer (SiC layer) 14 and forms a termination structure.

The MISFET 500 includes a conductive source electrode 34 to be electrically connected to the source region 18 and the p-well contact region 20. The source electrode 34 also functions as a p-well electrode that applies a potential to the p-well region 16.

The source electrode 34 is constituted by a stack of, for example, a nickel (Ni) barrier metal layer and an aluminum (Al) metal layer on the barrier metal layer. The Ni barrier metal layer and the Al metal layer may form an alloy by a reaction.

Furthermore, a conductive drain electrode 36 is formed on one side of the SiC substrate 12 that is the opposite side of the drift layer 14, that is, on the second face side. The drain electrode 36 is constituted by a stack of, for example, a nickel (Ni) barrier metal layer and an aluminum (Al) metal layer on the barrier metal layer. The Ni barrier metal layer and the Al metal layer may form an alloy by a reaction.

Note that, in the present embodiment, the n-type impurity is preferably, for example, nitrogen (N) or phosphorus (P), but arsenic (As) or antimony (Sb) is also applicable. Furthermore, the p-type impurity is preferably, for example, aluminum (Al), but boron (B), gallium (Ga), indium (In) or the like is also applicable.

Next, the first method for manufacturing the semiconductor device of the present embodiment will be described with reference to FIG. 14. The first manufacturing method includes performing nitriding treatment to a surface of a SiC layer having the surface inclined at an angle of 0° to 10° with respect to the {0001} face, forming a gate insulating layer after the nitriding treatment, performing first heat treatment in an atmosphere containing deuterium after forming the gate insulating layer, and forming a gate electrode on the gate insulating layer after the first heat treatment.

The nitriding treatment is, for example, thermal nitriding. For example, nitriding gas, such as NO, $N_2O$, or $NH_3$, is used. By the thermal nitriding, nitrogen (N) is substituted for silicon on the surface of the drift layer 14 and forms the termination structure. The gate insulating layer 28 is, for example, a silicon oxide film deposited by a low pressure chemical vapor deposition (LPCVD) method. The gate insulating layer 28 may be a thermal oxide film formed by a thermal oxidation method.

The first heat treatment is, for example, annealing. The annealing is performed, for example, in a deuterium 100% atmosphere at a temperature of 900° C. to 1200° C.

Deuterium introduced into the gate insulating layer 28 by the annealing segregates on the interface between the drift layer 14 and the gate insulating layer 28 and forms the interface region 60. More specifically, deuterium is bonded to the dangling bond of carbon on the interface between the drift layer 14 and the gate insulating layer 28 and distributed in the interface.

Next, the gate electrode 30 is formed on the gate insulating layer 28 by a known process. The gate electrode 30 is, for example, doped polysilicon formed by the LPCVD method.

Thereafter, the interlayer insulating film 32, the source electrode 34, and the drain electrode 36 are formed by the known process, and the MISFET 500 of the present embodiment illustrated in FIG. 14 is manufactured.

Note that, after forming the interface region 60 by the annealing in the atmosphere containing deuterium, second heat treatment of 800° C. or more is performed. The second heat treatment is, for example, activation annealing to activate a dopant of doped polysilicon. The second heat treatment is, for example, silicide annealing in the case where the source electrode 34 or the drain electrode 36 is formed with silicide. Moreover, the second heat treatment is, for example, the annealing to densify the interlayer insulating film 32. The second heat treatment is performed, for example, at 1000° C. or more and 1200° C. or less.

Next, the second method for manufacturing the semiconductor device of the present embodiment will be described with reference to FIG. 14. The second manufacturing method includes performing nitriding treatment to a surface of a SiC layer having the surface inclined at an angle of 0° to 10° with respect to the {0001} face, forming a gate insulating layer by thermally-oxidizing the surface in an atmosphere containing deuterium and oxygen after the nitriding treatment, and forming a gate electrode on the gate insulating layer.

The nitriding treatment is, for example, thermal nitriding. For example, nitriding gas, such as NO, $N_2O$, or $NH_3$, is used. By the thermal nitriding, nitrogen (N) is substituted for silicon on the surface of the drift layer 14 and forms the termination structure.

After the nitriding treatment, the surface of the n⁻-type drift layer (SiC layer) 14 is thermally oxidized in the atmosphere containing deuterium and oxygen. For example, the surface of the drift layer 14 is thermally oxidized in an atmosphere of heavy water steam ($D_2O$). The oxidation temperature is, for example, 800° C. or more and 1200° C. or less.

With the thermal oxidation, the gate insulating layer 28 is formed. Furthermore, deuterium introduced into the gate insulating layer 28 segregates on the interface between the drift layer 14 and the gate insulating layer 28 and forms the interface region 60. More specifically, deuterium is bonded to the dangling bond of carbon on the interface between the drift layer 14 and the gate insulating layer 28 and distributed in the interface.

Note that, the gate insulating layer 28 may be formed by further depositing an insulating film after thermally oxidizing the surface. The insulating film in this case is, for example, a silicon oxide film deposited by the LPCVD method.

Next, the gate electrode 30 is formed on the gate insulating layer 28 by a known process. The gate electrode 30 is, for example, doped polysilicon formed by the LPCVD method.

Thereafter, the interlayer insulating film 32, the source electrode 34, and the drain electrode 36 are formed by the known process, and the MISFET 500 of the present embodiment illustrated in FIG. 14 is manufactured.

Next, the third method for manufacturing the semiconductor device of the present embodiment will be described with reference to FIG. 14. The third manufacturing method includes performing nitriding treatment to a surface of a SiC layer having the surface inclined at an angle of 0° to 10° with respect to the {0001} face, forming a gate insulating layer by thermally-oxidizing the surface in an atmosphere containing oxygen after the nitriding treatment, forming a gate electrode on the gate insulating layer, and performing a thermal treatment in an atmosphere containing deuterium.

The nitriding treatment is, for example, thermal nitriding. For example, nitriding gas, such as NO, $N_2O$, or $NH_3$, is used. By the thermal nitriding, nitrogen (N) is substituted for silicon on the surface of the drift layer 14 and forms the termination structure.

After the nitriding treatment, the surface of the n⁻-type drift layer (SiC layer) 14 is thermally oxidized in the atmosphere containing oxygen. For example, the surface of the drift layer 14 is thermally oxidized in an atmosphere of water steam ($H_2O$). The oxidation temperature is, for example, 800° C. or more and 1200° C. or less.

With the thermal oxidation, the gate insulating layer 28 is formed.

Note that, the gate insulating layer 28 may be formed by further depositing an insulating film after thermally oxidizing the surface. The insulating film in this case is, for example, a silicon oxide film deposited by the LPCVD method.

Next, the gate electrode 30 is formed on the gate insulating layer 28 by a known process. The gate electrode 30 is, for example, doped polysilicon formed by the LPCVD method.

After the gate electrode 30 is formed, a thermal treatment is performed in an atmosphere containing deuterium. The temperature of the thermal treatment is, for example, 800° C. or more and 1200° C. or less. The thermal treatment may be performed in non-oxidizing condition.

With the thermal treatment, deuterium introduced into the gate insulating layer 28 and segregates on the interface between the drift layer 14 and the gate insulating layer 28 and forms the interface region 60. More specifically, deuterium is bonded to the dangling bond of carbon on the interface between the drift layer 14 and the gate insulating layer 28 and distributed in the interface.

Thereafter, the interlayer insulating film 32, the source electrode 34, and the drain electrode 36 are formed by the known process, and the MISFET 500 of the present embodiment illustrated in FIG. 14 is manufactured.

Note that, treatment to supply phosphorus (P) to the surface of the drift layer 14 may be performed instead of the nitriding treatment in the above manufacturing method. The treatment to supply phosphorus (P) is, for example, solid-phase diffusion from phosphorus glass. The treatment to supply phosphorus (P) is, for example, annealing or oxidizing in an atmosphere containing phosphorus. The supplied phosphorus is substituted for silicon on the surface and forms the termination structure.

In the present embodiment, silicon atom that dominantly exists on the silicon face is substituted with nitrogen or phosphorus and terminated. Then, the dangling bond of carbon is terminated with deuterium strongly bonded to carbon.

As described in the first embodiment, the bond between deuterium and the dangling bond of carbon is stronger than that between hydrogen and the dangling bond of carbon and has high heat resistance and electrical stress resistance.

Consequently, the MISFET 500 having small characteristic variation and high reliability can be implemented in comparison with, for example, the case where the termination structure is formed with nitrogen or phosphorus alone, or with nitrogen or phosphorus and hydrogen.

As described above, according to the present embodiment, the interface state between the SiC layer and the gate insulating layer is reduced, and the MISFET 500 having high mobility can be implemented. Furthermore, by applying deuterium strongly bonded to carbon to the termination structure, the MISFET 500 having high reliability can be implemented.

As described above, in the embodiments, while it has been described the case where a crystal structure of silicon carbide is 4H—SiC, the present disclosure is applicable to silicon carbide having a 6H—SiC, 3C—SiC, or other crystal structure.

While certain embodiments have been described, these embodiments have been presented by way of example only, and are not intended to limit the scope of the inventions. Indeed, the semiconductor device and the method for manufacturing the same described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device comprising:
a SiC layer having a surface, the surface inclined at an angle of 0° to 10° with respect to a {000-1} face or the surface, having a normal line direction inclined at an angle of 80° to 90° with respect to a <000-1> direction;
a gate electrode;
a gate insulating layer provided between the surface and the gate electrode; and
a region provided between the surface and the gate insulating layer, a maximum concentration of deuterium (D) in the region being $1\times10^{20}$ cm$^{-3}$ or more and a maximum concentration of hydrogen (H) in the region being $1\times10^{19}$ cm$^{-3}$ or less.

2. The device according to claim 1, wherein concentration distribution of deuterium in the region has a peak, and a full width at half maximum of the peak is 10 nm or less.

3. The device according to claim 1, wherein the maximum concentration of deuterium in the region is $1\times10^{21}$ cm$^{-3}$ or more.

4. The device according to claim 1, wherein the gate insulating layer is a silicon oxide film.

5. A method for manufacturing a semiconductor device comprising:
forming a gate insulating layer on a surface of a SiC layer, the surface inclined at an angle of 0° to 10° with respect to a {000-1} face, or, the surface having a normal line direction inclined at an angle of 80° to 90° with respect to a <000-1> direction;
performing first heat treatment in an atmosphere containing deuterium after forming the gate insulating layer; and
forming a gate electrode on the gate insulating layer after performing the first heat treatment.

6. The method according to claim 5, wherein the gate insulating layer is a silicon oxide film.

7. The method according to claim 5, further comprising performing second heat treatment of 800° C. or more after the first heat treatment.

8. The method according to claim 5, wherein the gate insulating layer is a deposition film.

9. The method according to claim 5, wherein the gate insulating layer is a thermal oxide film.

10. The method according to claim 5, wherein the first heat treatment is performed at 900° C.

11. A method for manufacturing a semiconductor device comprising:
forming a gate insulating layer on a surface of a SiC layer, the forming the gate insulating layer including thermally-oxidizing the surface in an atmosphere containing deuterium and oxygen, the surface inclined at an angle of 0° to 10° with respect to a {000-1}face, or the surface having a normal line direction inclined at an angle of 80° to 90° with respect to a <000-1> direction; and
forming a gate electrode on the gate insulating layer.

12. The method according to claim 11, wherein the gate insulating layer is formed by depositing an insulating film after the thermally-oxidizing the surface.

13. The method according to claim 12, wherein the insulating film is a silicon oxide film.

14. The method according to claim 11, further comprising performing a heat treatment of 800° C. or more after the forming the gate insulating layer.

15. The method according to claim 11, wherein the thermally-oxidizing the surface is performed at 800° C. or more.

16. The method according to claim 11, comprising bonding deuterium (D) in the region to carbon at the surface.

17. The device according to claim 1, wherein deuterium (D) in the region is bonded to carbon at the surface.

18. The method according to claim 5, comprising bonding deuterium (D) in the region to carbon at the surface.

* * * * *